United States Patent [19]

Ruigrok et al.

[11] Patent Number: 4,996,621
[45] Date of Patent: Feb. 26, 1991

[54] SUPERCONDUCTING DEVICE FOR READING INFORMATION FROM A MAGNETIC RECORDING MEDIUM

[75] Inventors: Jacobus J. M. Ruigrok; Victor Zieren, both of Eindhoven; Ulrich E. Enz, Geldrop; Willem F. Druyvesteyn, Eindhoven, all of Netherlands

[73] Assignee: U.S. Philips Corporation, New York, N.Y.

[21] Appl. No.: 265,362

[22] Filed: Oct. 28, 1988

[30] Foreign Application Priority Data

Nov. 2, 1987 [NL] Netherlands .................. 8702607

[51] Int. Cl.⁵ .............................................. G11B 5/147
[52] U.S. Cl. .................................... 360/126; 324/248; 505/845

[58] Field of Search ............... 360/110, 113, 125, 126; 324/248, 249; 505/845

[56] References Cited

U.S. PATENT DOCUMENTS 4,782,415 11/1988 Vinal ................................... 360/113

Primary Examiner—A. J. Heinz
Attorney, Agent, or Firm—Bernard Tiegerman

[57] ABSTRACT

Device is provided for reading information from a magnetic recording medium, comprising a SQUID (15), a magnetic yoke formed from two flux guides (3 and 5) and a face (13) for magnetic flux coupling of the SQUID with the magnetic recording medium. The SQUID is provided with connection means (33) for a detection circuit (35).

17 Claims, 3 Drawing Sheets

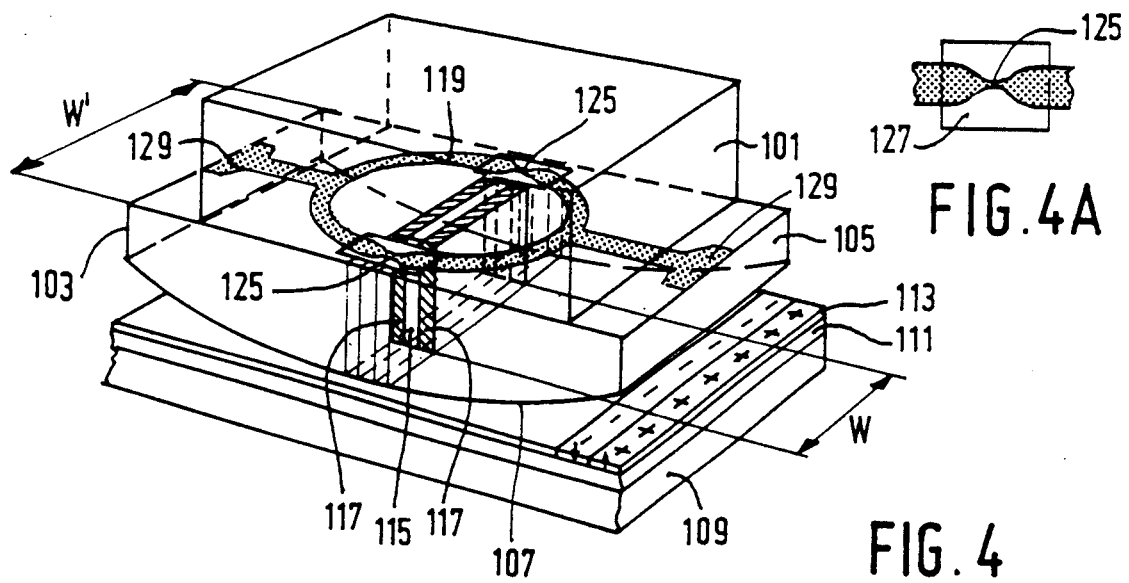
FIG. 4A
FIG. 4
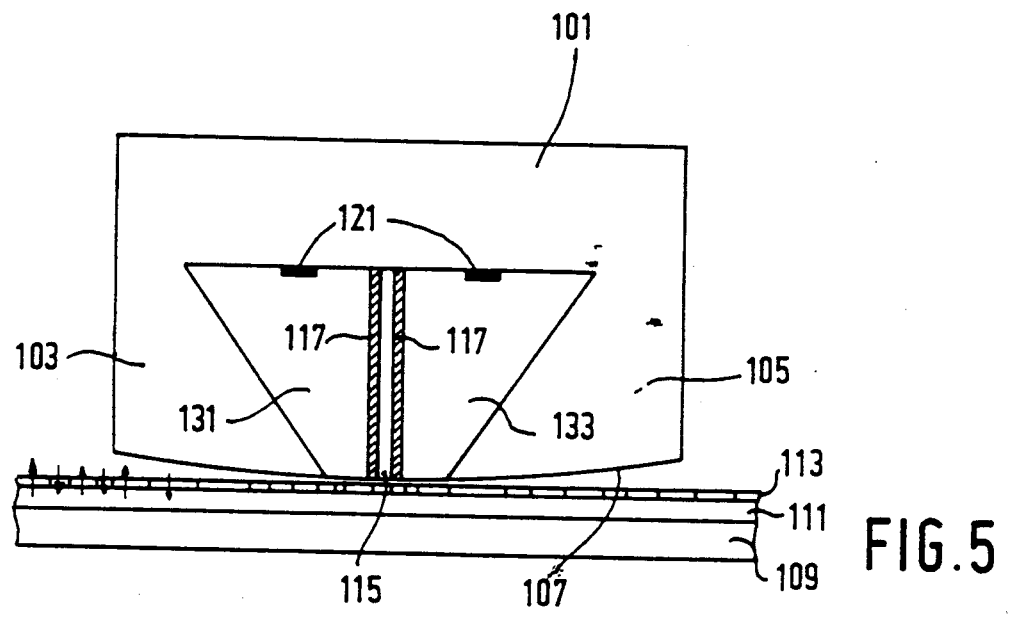
FIG. 5
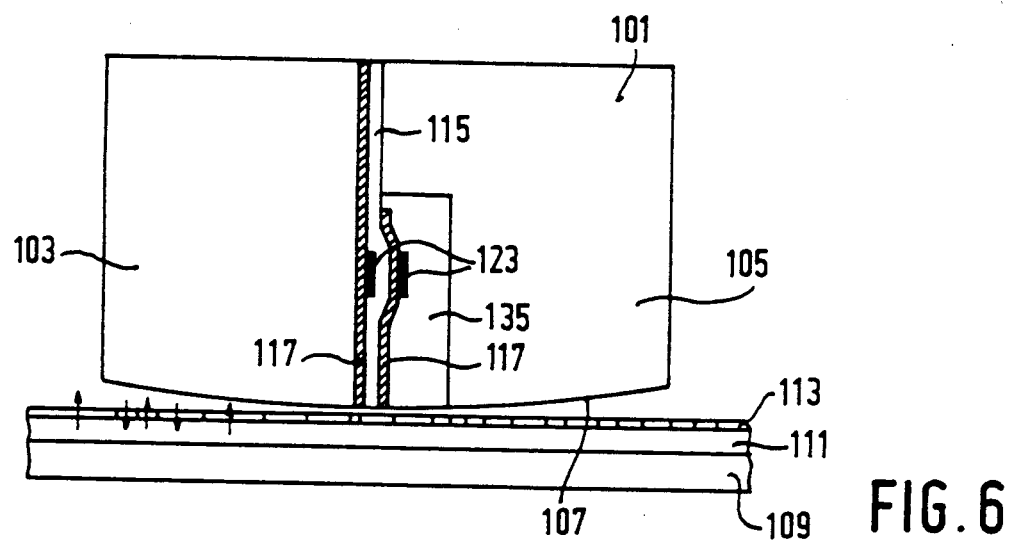
FIG. 6

SUPERCONDUCTING DEVICE FOR READING INFORMATION FROM A MAGNETIC RECORDING MEDIUM

BACKGROUND OF THE INVENTION

The invention relates to a device for reading information from a magnetic recording medium, which device comprises a transducing element and a magnetic yoke co-operating with the transducing element and being provided with a first flux guide and a second flux guide spatially separated locally therefrom, said device also having a face for magnetic flux coupling of the transducing element with the magnetic recording medium. A device of this type is known from U.S. Pat. No. 4,489,357 (herein incorporated by reference).

Devices for reading information from a magnetic recording medium are generally known and their use is still increasing as a result of novel magnetic recording systems, particularly those relating to computer applications, video applications and digital audio applications. The recording medium may have the shape of a magnetic disc, a drum or a tape, or any other magnetic body which is capable of receiving and storing data with a high density. Whatever type of magnetic medium is used, it will always be necessary to use a device for recording information in the medium and a device for reading this information when necessary. These devices have been developed in a wide variety of designs, and the known devices for reading information can in principle be divided into two types, namely the devices of the inductive type provided with an inductive element particularly an electric coil, and the devices of the magneto-resistive type provided with a magneto resistive element.

An example of the first-mentioned type is shown in the form of an inductive magnetic head for vertical recording in Netherlands Patent Application No. 8,303,023 and an example of the last-mentioned type is shown in the form of a thin-film read head in U.S. Pat. No. 4,489,357. The thin-film magnetic head known from U.S. Pat. No. 4,489,357 has an elongated magnetoresistive element bridging a gap located between two co-planar magnetically permeable layers and is provided at two facing ends with contacts for connection to a measuring current source.

It is to be noted that the sensitivity of inductive read heads is limited, at low frequencies, because the output voltage across the coil ends is slow due to the proportionality of the voltage with the time derivative of the changing flux threading the coil. This problem cannot be solved by using a coil having a large number of turns, because such a coil is largely impracticable from a technological point of view and, moreover, the resistance of the coil would increase drastically so that thermal noise would be a problem.

As is assumed to be known, magnetoresistive read heads supply an output voltage which is proportional to the flux applied to the magnetoresistive element. Therefore, these heads are very sensitive at low frequencies. A drawback of the magnetoresistive read heads is their low magnetic efficiency due to the high magnetoresistance which is caused, inter alia, by the thin magnetoresistive element. Another drawback of the magnetoresistive read heads is that these heads have a rather high interference level due to the occurence of the so-called Barkhausen effect which relates, inter alia, to the interaction between the magnetoresistive element and the flux guides. More information on these aspects can be found, for example in the Article "The effect of laminating permalloy flux guides in a thin film magnetic recording head" by J.A.C. van Ooijen; Europhysics Conference Abstracts, soft Magnetic Materials 5, 1981, pages 131, 132.

SUMMARY OF THE INVENTION

It is an object of the invention to modify the device so that a device is obtained which, in common with the magneto-resistive read heads, is sensitive to magnetic flux but in which the Barkhausen noise does not occur or occurs to a slight extend only, so that the device is very suitable for reproducing notably low-frequency signals with extreme sensitivity. These low-frequency signals may be audio signals but may also be digital signals from, for example, multitrack information systems.

To achieve the envisaged object, the device according to the invention is characterized in that the transducing element is constituted by a superconducting quantum interference device (SQUID), provided with connection means for a detection circuit. Because of the properties of the SQUID, such a device is very suitable for reading and reproducing, without interference, the information laid down in the form of variations in the magnetization of the magnetic recording medium, particularly information which is related to low-frequency signals. In addition, such a device has a low thermal noise and a high efficiency.

SQUIDS are known per se and have been described, inter alia, in the book "Experimental Principles and Methods Below 1K" by O.V. Lounasma, Chapter 7, Academic press, London and New York, 1974. In principle, a SQUID comprises a superconducting body which is interrupted at one or two junctions by a thin insulating layer, such as an oxide layer, to provide a weak link at said junction or junctions.

The superconducting body and the weak link or links constitute a closed loop enclosing a surface in which a magnetic flux $\phi$ can be imposed. As a result of the tunnel effect a superconducting current passage (current I) is possible between the superconducting parts separated from each other by a weak link. If a voltage difference U is produced across the weak link, the Josephson effect will convert the power at least partly into a microwave power having a frequency $F = 2eU/H$, where h is Planck's constant.

As already stated hereinbefore, the SQUID has one or two weak links. A SQUID having one weak link is referred to as an r.f. biased SQUID, or r.f. SQUID for short, whilst in the literature it is also referred to as an a.c. SQUID. A SQUID having two weak links is referred to as d.c. biased SQUID, often abbreviated to d.c. SQUID.

Various embodiments are possible within the scope of the invention. A first category of embodiments of the invention relates to devices in which one of the flux guides projects through the SQUID. A second category of embodiments of the invention relates to devices in which a winding of a superconducting material is provided around one of the flux guides, which winding is inductively coupled to the SQUID by means of an electric conductor of a superconducting material.

In the embodiment of the second category the superconducting winding, referred to as a pick-up winding, forms part of a so-called flux transformer which has a further winding, referred to as secondary winding, in the proximity of the SQUID. The pick-up winding of the flux transformer, which is entirely superconducting and within which the flux is consequently maintained, passes the changes of the total flux through the flux guide of the device to the secondary winding, substantially without loss, provided that the inductance of the connection between pick-up and secondary windings is small with respect to that of the secondary winding. The secondary winding may be coupled in known manner to an r.f. and d.c. SQUID. However, the flux variations at the area of the secondary winding are at most half the external flux variations at the area of the winding, $\phi_{ext}$, that is to say, the flux due to the external fields to be measured. The optimum is reached when the inductance of the pick-up winding is equal to the inductance of the secondary winding. It does not make much difference for the ultimate output of the device whether the SQUID is directly or indirectly coupled to the magnetic yoke, as in the embodiments of the first category or in the embodiments of the second category, respectively.

In all embodiments the current circulating in the superconducting lop of the SQUID will assume such a value during operation of the device that the total flux in the loop, hence that resulting from the flux in the flux guide and that resulting from the current $i_s$ circulating through the loop, $\phi_i = i_s L/N$, in which N is the number of windings and will be usually equal to one, will be exactly equal to an integral number of times the flux quantum (fluxon) $\phi_0 = h/2 |e|$, plus a part $(\theta/2\pi) \cdot \phi_0$ in which $\theta$ is the phase difference in the wave function of a Cooper pair (2 paired electrons with a total spin of 0) across the junction or junctions due to the supercurrent $i_s$ through the junction or junctions. In this equation $2|e|$ is the charge of the Cooper pair and h is Planck's constant. If a fluxon penetrates the loop of the SQUID or it it leaves this loop, it will do so at the location of the weakest part of the loop, the so-called weak link, at the instant when the critical current at which the weak link is just not superconducting is exceeded. All Cooper paris are in one and the same macroscopic quantum state so that phase differences of only $n2\pi n$ are possible throughout the loop due to the uniformity of the wave function describing the state. The phase variation across the loop is determined by the (generalized) instant which comprises a kinetic part, which is determined inter alia by the velocity of displacement of the Cooper pairs supplying the circulating current $i_s$, and a potential part due to the total loop flux inside the loop. Thus a fixed current or possibly a plurality of fixed currents suits any given external magnetic flux. The circulating current changing with an increasing external flux is periodical, with the flux quantum $\phi_0$ as a period in the external flux, assuming that the critical current $I_c$, which is determined by the properties of the weak link, is sufficiently small, that is to say $LI_c \sim \phi_0$, with L being inductance of the loop of the SQUID. The periods can be retraced in the output signal and they can be counted by means of a digital counter. However, the known negative feedback mode will preferably be used in the device according to the invention. To this end an extra flux is coupled into the SQUID by means of a negative feedback current via, for example an extra winding such that the total loop flux remains constant and the output signal of the SQUID thus remains invariably at its bias point. This fixed bias point is preferably located on the steepest portion of the sensitivity curve of the SQUID.

The value of the negative feedback current is measured and is a direct measure of the external magnetic flux.

The latter method is conventionally used for inter alia a d.c. SQUID because it is biased by means of a d.c. current. Fractions of a flux quantum can thus be measured. The output of an r.f. SQUID is generally inductively coupled to a coil from an LC circuit which is controlled at its resonant frequency by an r.f. current source having a frequency of, for example 20 MHz. Here it is also possible to use negative feedback. The negative feedback signal can be presented via an extra winding but also via an r.f. winding or the secondary winding. Due to the parametric operation of the SQUID and the resonant LC circuit the flux variations appear as sidebands of the r.f. signal across the LC circuit.

Although the sensitivity, that is to say the variation of the output signal at an infinitesimal variation of the flux to be measured, of the SQUID usually does not increase when decreasing the number of turns of the SQUID loop, this number of turns is preferably chosen to be equal to one because the amplitude of the periodical output signal increases. A decrease of the inductance of the SQUID loop, with the number of turns remaining constant does result in an increased sensitivity and usually also in an increase of the signal-to-noise ratio. This means that when the flux to be measured remains constant, smaller embodiments of the device according to the invention usually have a more favourable signal-to-noise ratio due to their smaller inductance. Also the increase of the frequency, $f_o$, of the r.f. signal, which is permitted as long as $2\pi f_o \leq R/L$ in which R is the ohmic resistance of the weak links, will usually improve the sensitivity and the signal-to-noise ratio. Also for this purpose as low L, hence a small size of the device according to the invention is favourable.

For a more detailed description of the different types of SQUIDS and the associated SQUID electronics reference is made to the relevant existing literature such as, for example the above-cited book "Experimental Principles and Methods Below 1K" by O.V. Lounasmaa, and the following publications by John Clarke: "Electronics with superconducting junctions", Physics Today, August 1971, pages 30–37, "SQUIDS, Brains and gravity Waves", Physics Today, March 1986, pages 36–44, and "Low-Frequency Applications of Superconducting Quantum Interference Devices", Proceedings of the IEEE, volume 61, no. 1, January 1973, pages 8–19. Furthermore reference is made to European Patent Application 0,212,452 showing a flux transformer inductively coupled to a d.c. SQUID. This Application also describes the modulation of the measuring signal in the flux transformer with a signal in a frequency band in which the self noise of the SQUID and the associated electronics are minimal. Furthermore U.S. Pat. No. 4,324,255, describes a combination of an r.f. SQUID and a flux transformer. In this combination an induction voltage is generated by means of a coil around a toroid conveying a flux which is representative of the signal to be measured, which induction voltage is applied through a coaxial cable to a second coil which is inductively coupled to the first coil of the flux transformer.

The expression "superconducting material" is herein understood to mean a material which is in a superconducting state and which has the full or substantially full Meissner effect. For practical reasons materials having a relatively high critical temperature are preferred, for example above the temperature at which nitrogen liquifies at normal pressure. Suitable materials, are, for example, superconducting ceramic materials formed from compounds of lanthanum, barium, copper and oxygen such as $La_{1-x}Ba_xCuO_4$ with x between 0.15 and 0.6; lanthanum, strontium, copper and oxygen such as $La_{2-x}Sr_xCuO_4$ with x between 0.15 and 0.2; yttrium, barium, copper and oxygen such as $YBa_2Cu_3O_{7-d}$ with d between 0.0 and 1.0 or $Y_{0.4}Ba_{0.6}Cu_{1.0}O_{3.0}$; or yttrium, barium, strontium, copper and oxygen such as $YBa_{2-x}Sr_xCu_3O_{7-d}$, with d between 0.1 and 0.5 and x between 0 and 2 in which a part of the elements may be partly replaced for example, oxygen by fluorine or strontium by calcium, and in which x is preferably equal to 0, in which case Ba may be replaced by Sr and Y may be replaced by a rare earth metal.

A preferred embodiment of the first category in which the device comprises a substrate on which a first magnetically permeable layer constituting the said first flux guide and a second magnetically permeable layer constituting the said second flux guide are provided, between which permeable layers a transducing gap extends up to the said face for magnetic flux coupled is characterized in that the SQUID is provided around the second magnetically permeable layer, whilst a portion of the SQUID is present between the two magnetically permeable layers. This device can be composed in accordance with a thin-film technique from a plurality of layers to form a small compact unit in which the transmission losses are limited to a minimum.

The above-mentioned preferred embodiment is preferably also characterized in that an intermediate layer of a superconducting material is provided between the first magnetically permeable layer and the second magnetically permeable layer, the said portion of the SQUID being preferably present between the intermediate layer and the second magnetically permeable layer. The Meissner effect prevents a magnetic short-circuit flux from occurring between the parts of the magnetically permeable layers present on either side of the intermediate layer of a superconducting material, which has, of course, a favourable influence on the magnetic efficiency of the device.

Another preferred embodiment of the first category is characterized in that the device comprises a core body of a soft magnetic material having at least one protective block which is provided with a contact face for co-operating with the magnetic recording medium, and a magnetic pole element of a soft magnetic material extending from the core body to the proximity of the contact face, the pole element forming part of the said first flux guide and the core body constituting the said second flux guide, and in that the SQUID is provided around the magnetic pole element. This device is also very suitable for reproducing notably low-frequency signals with extreme sensitivity. To achieve a maximum possible efficiency, the protective block will preferably consist at least partly of a soft magnetic material and a space accommodating at least a portion of the SQUID will be present between the magnetic pole portion and the protective block. To inhibit stray flux the pole element is preferably at least partly coated with a layer of a superconducting material.

A preferred embodiment of the second category in which the device comprises a substrate on which a first magnetically permeable layer constituting the said first flux guide and a second magnetically permeable layer constituting the said second flux guide are provided, between which permeable layers a transducing gap extending up to the said face for magnetic flux coupling is present, is characterized in that the winding is provided around the second magnetically permeable layer, whilst a portion of the winding is present between the two magnetically permeable layers. The winding may be provided by means of a thin-film technique and may be connected inductively to an r.f. SQUID or to a d.c. SQUID by means of the superconducting conductor. To prevent unnecessary losses, the length of the said conductor will be kept as short as possible.

The latter preferred embodiment is preferably also characterized in that an intermediate layer of a superconducting material is provided between the first magnetically permeable layer and the second magnetically permeable layer, whilst the said portion of the winding is preferably provided between the intermediate layer and the second magnetically permeable layer. For the reasons already mentioned hereinbefore the occurrence of magnetic short-circuit flux between the magnetically permeable layers is inhibited thereby.

A very compact, efficient and easy to manufacture device is obtained if the latter preferred embodiment is characterized in that a third magnetically permeable layer and a fourth magnetically permeable layer are provided on the substrate, which layers form part of a transformer yoke, whilst the said electric conductor is wound around one of the said layers of the transformer yoke and the SQUID is provided around one of the said layers of the transformer yoke, a portion of the SQUID being present between the two magnetically permeable layers of the transformer yoke. For reasons stated hereinbefore the inductance of the conductors between pick-up and secondary windings will preferably be small with respect to that of the two windings and the inductance of the two windings will also be chosen to be equal, because then the maximum part of the external flux, namely half of it, reaches the transformer yoke. To achieve this, the said conductors should be short and possibly twisted and the two windings will consist of a sufficient plurality of turns in such a ratio that the inductances of the pick-up and secondary windings approximate each other as nearly as possible. To increase the coupling factor of the transformer section of the device according to the invention, it is favourable to provide a further intermediate layer of a superconducting material between the third magnetically permeable layer and the fourth magnetically permeable layer whilst the said portion of the SQUID is present between the said intermediate layer and one of the magnetically permeable layers of the transformer yoke.

BRIEF DESCRIPTION OF THE DRAWINGS

FIG. 4 is a perspective elevational view of a fourth embodiment.

FIG. 4a is a plan view of a detail of FIG. 4,

FIG. 5 is a side view of a fifth embodiment and

FIG. 6 is a side view of a sixth embodiment, the device according to the invention.

DETAILED DESCRIPTION OF THE DRAWINGS

Figure 1:
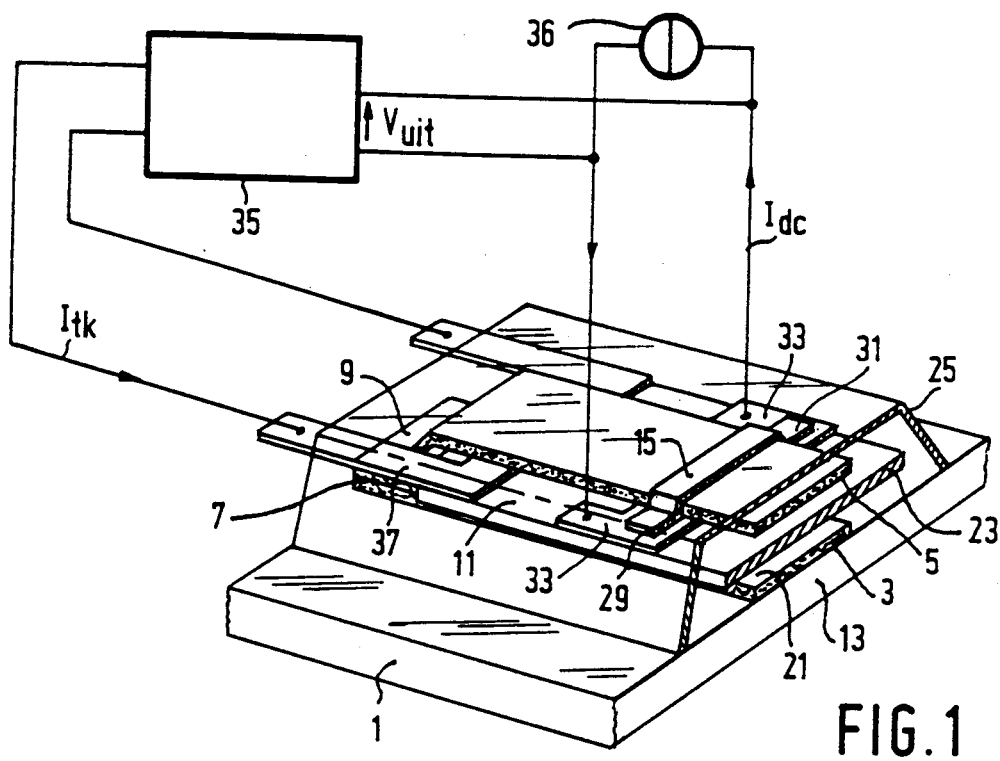
FIG. 1 is a diagrammatic perspective of a first embodiment realised in a thin-film structure.
Figure 2:
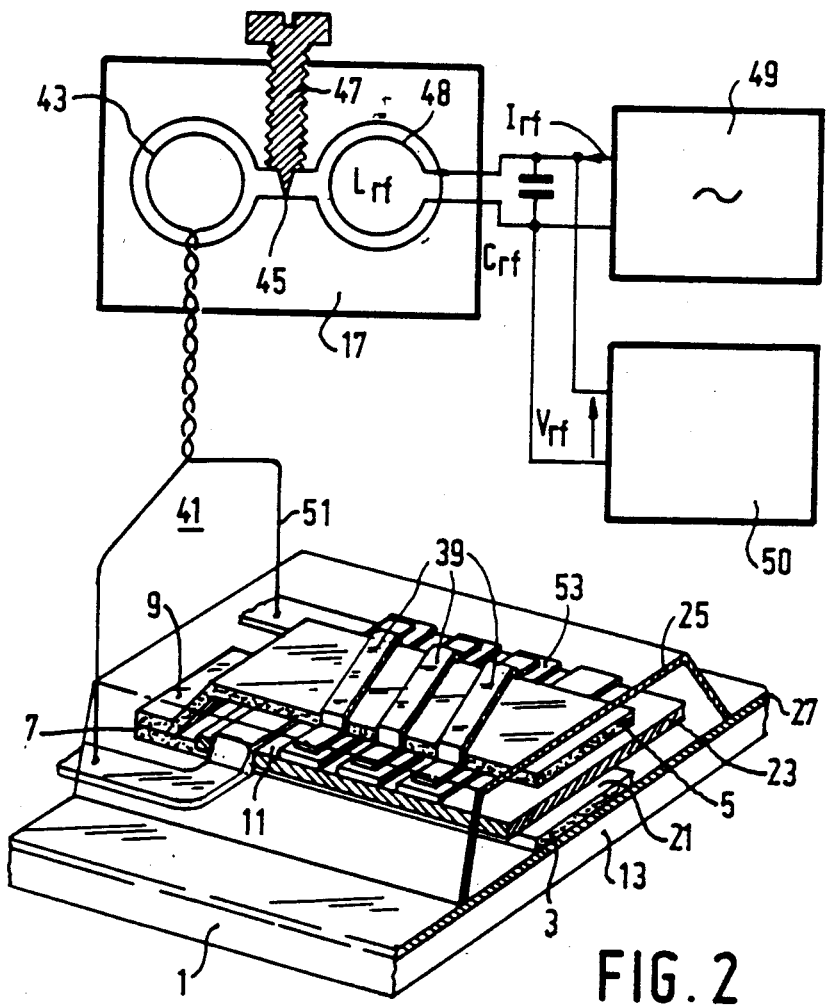
FIG. 2 shows diagrammatically a second embodiment partly realised in a thin-film structure.
Figure 3:
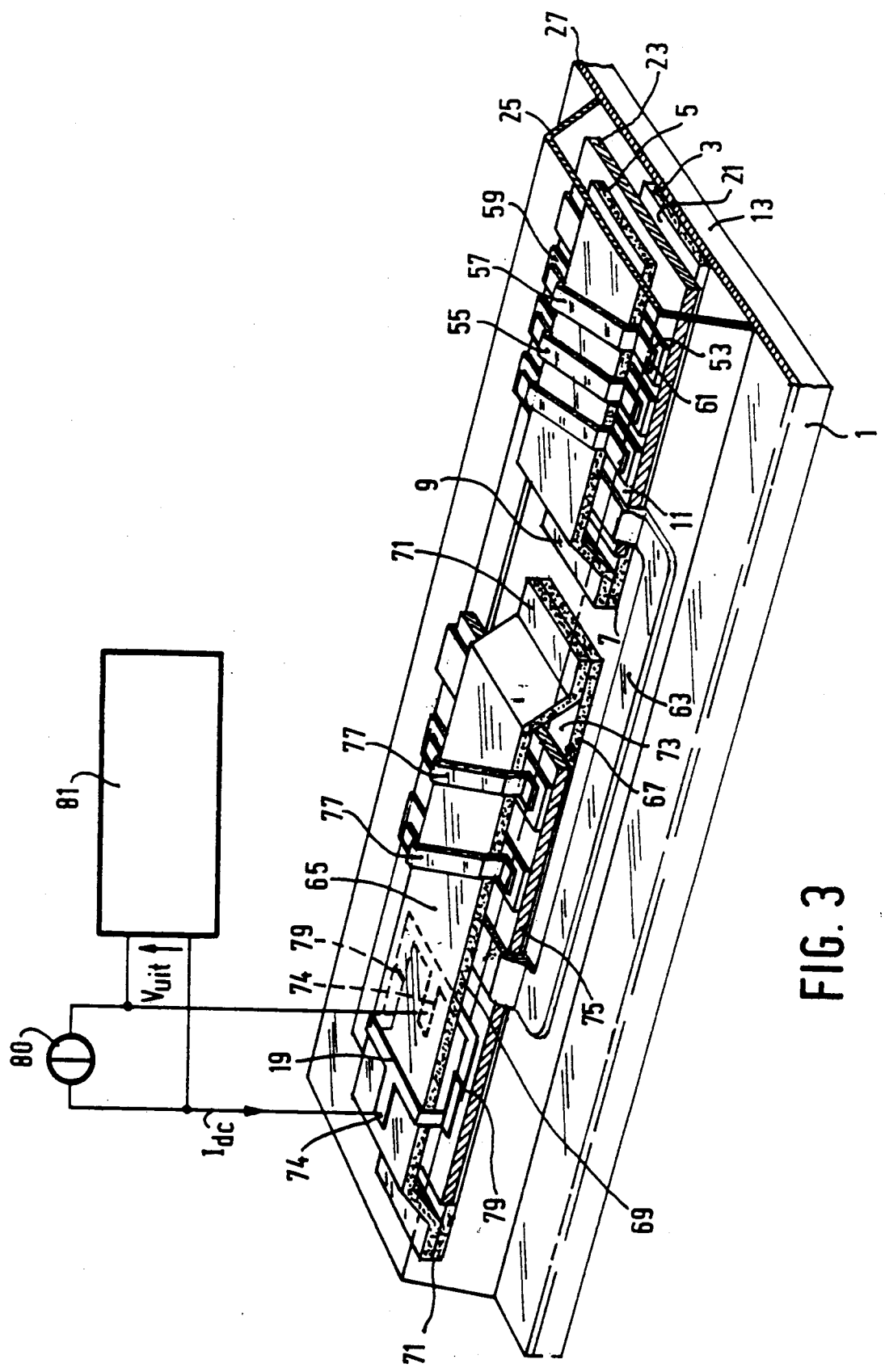
FIG. 3 shows diagrammatically a third embodiment entirely realised in a multilayer thin-film structure.

The corresponding components in FIGS. 1, 2 and 3 have the same reference numerals. The embodiments according to the invention shows in FIGS. 1, 2 and 3 form one assembly with a substrate 1 of a non-conducting material such as glass and may be entirely or partly made as a multi-player thin-film structure provided on the substrate 1. Techniques and processes such as sputtering or vapour deposition known from the thin-film technique may be used to realize the multilayer structure. The multilayer structure comprises a first layer 3 of a magnetically permeable material such as a nickle-iron alloy or an iron-silicon-aluminum alloy and a second layer 5 of a similar material. The layers 3 and 5 serve as flux guides. The first magnetically permeable layer 3 is deposited on the substrate 1, whilst the second magnetically permeable layer 5 is provided in such a way that the two layers 3 and 5 are magnetically connected together in a region denoted by the reference numeral 7 and are magnetically insulted from each other outside this region. The layers 3 and 5 combined thus constitute a magnetic yoke 9 having an internal space 11. The embodiments also have a face 13 for magnetic flux coupling of a SQUID with a magnetic recording medium. The SQUID is denoted by the reference numerals 15, 17 and 19 in FIGS. 1, 2 and 3, respectively. An intermediate layer 23 of a superconducting material is present in the intermediate space 11 which constitutes a transducing gap 21 in the proximity of the face 13. The device may also have a protective layer 25 and a shield 27 arranged between a substrate 1 and the layer 3, both made of a superconducting material, for protecting the device from disturbing external magnetic fields. This inventive measure also further improves the efficiency of the head. A suitable superconducting material comprises, for example yttrium, copper and oxygen which, according to an Article in the Journal JEI of August 1987, has been proved to be superconducting at 27° C.

To prevent needless complication of the Figures, the required electrically insulating layers, usually sputtered oxides, are omitted in these Figures. Where short circuits must be avoided, insulation layers are of course provided. For the sake of clarity it has also been assumed that some layers are transparent. The embodiments of FIGS. 1, 2 and 3 will now be separately described in greater detail.

The SQUID present in the embodiment of FIG. 1 is a d.c. SQUID having two Josephson Junctions as weak links denoted by the reference numerals 29 and 31. On either side of the junctions 29 and 31 the SQUID consists of a superconducting layer, for example formed by means of a sputtering process. The junctions 29 and 31 may be formed from a sputtered oxide layer. As can clearly be seen in FIG. 1, the magnetically permeable layer 5 functioning as a flux guide projects through the annular SQUID 15, which SQUID is partly present between this layer 5 and the intermediate layer 23. The SQUID has two contact faces 33 which are connected to a current source 36 and a detection circuit 35 (shown diagrammatically).

The embodiment of FIG. 1 has a winding 37 which forms part of a negative feedback. Consequently an extra magnetic flux can be coupled into the SQUID 15 by means of a negative feedback current $I_{tk}$ through the winding 37 such that the total loop flux and hence the output signal of the SQUID remains unchanged at its bias point.

The embodiment of FIG. 2 has a winding 39 which forms part of a flux transformer 41 which is also provided with a secondary winding 43 which is inductively coupled to the r.f. SQUID 17. The SQUID 17 whose junction 45 is of the point-contact type and which is constituted by the head of a superconducting screw 47 is inductively coupled to an LC circuit 48 of a detection circuit 50 tuned to the frequency of the r.f. oscillator 49. The pick-up winding 39 comprises a plurality of turns composed of thin layers of a superconducting material. The winding 39 is provided around the flux guide constituted by the magnetically permeable layer 5, whilst the lead-outs of the winding are connected to a conductor 51 of the flux transformer 41. The superconducting parts of the turns constituting the winding 39 and being present above and below the layer 5 are interconnected, of course in a superconducitng manner, on either side of the layer 5. The superconducting transitions are denoted by the reference numeral 53.

The embodiment of FIG. 3 is an alternative to the embodiment of FIG. 2 and mainly differs in that the SQUID is also realised in a thin-film technique using a common substrate 1 in this embodiment. This embodiment has a pick-up winding 55 whose construction entirely corresponds to the winding 39 described hereinbefore. The winding 55, which is composed of layers 57 and 59 of a superconducting material connected together by means of contact faces 61 and extending above and below the layer 5, is provided with lead-outs which are connected to a superconducting conductor 63. The conductor 63 is wound around a transformer yoke 65, preferably in the form of one turn. The transformer yoke is provided on the substrate 1 by a thin-film technique. In principle, the transformer yoke 65 consists of two magnetically permeable layers 67 and 69 which, for the purpose of distinguishing the afore-mentioned magnetically permeable layers, can be indicated as third and fourth magnetically permeable layers, respectively. The layers 67 and 69 are magnetically connected together in regions 71 and thus constitute a closed yoke having an internal space 73. To increase the coupling factor the internal space 73 accommodates a layer 75 of a superconducting material. The said superconducting conductor 63 extends in the internal space 73 between the last-mentioned layer 75 and the magnetically permeable layer 65 and in this embodiment it has two turns 77. The above-mentioned SQUID 19 in a thin-film structure surrounds the magnetically permeable layer 6 of the transformer yoke 65 and is partly present between the superconducting layer 75 and the magnetically permeable layer 69. Two transitions 79 constituted by a very thin electrically insulating layer for forming two weak links are present between the portion of the SQUID 19 which is present above and below the magnetically permeable layer 69. The SQUID shown is therefore a d.c. SQUID. The SQUID 19 has contact faces 74 to which a detection circuit 81 and a current source 80 are connected.

The embodiments of the device according to the invention shown in FIGS. 4, 5 and 6 are particularly intended for use in vertical recording. Each embodiment is provided with a core body 101 of a soft magnetic material such as a ferrite which may be provided with one or two protective blocks. In each of the three embodiments shown two protective blocks are present, which are denoted by the reference numerals 103 and 105 and which constitute a contact face 107 for cooperating with a magnetic recording medium. The magnetic recording medium consists of a non-magnetic support 109, an intermediate layer 111 or a soft magnetic material and a permanently magnetized coating 113 provided thereon. The three embodiments also each comprise a magnetic pole element 115 extending between the core body 101 and the contact face. In a practical embodiment the pole element 115, which is only shown diagrammatically in the Figures, will be provided as a thin film of a soft magnetic material such as an alloy based on Ni and Fe, or Fe, Al and Si, or an amorphous sputtered material such as $Co_{86,1}Nb_{8,6}Zr_{5,3}$ or a non-amorphous material such as $Co_{86}Fe_6B_6Si_2$ having a saturation value $B_{s=}1,5T$. To prevent stray flux, the pole element may be entirely or partly coated on one or two sides with a layer 117 of a superconducting material. An important common feature of the devices of Figures 4, 5 and 6 is the presence of a SQUID, denoted by the reference numerals 119, 121 and 123, respectively, provided around the pole element 115.

Some details of the devices of FIGS. 4, 5 and 6 will now be briefly explained. The protective blocks 103 and 105 of the device of FIG. 4 are made of a non-magnetic material. Ass the magnetic pole element 115 is clamped in between the two protective blocks 103 and 105, this device has, as it were, two semi-infinite gaps on either side of the pole element 115. The protective blocks 103 and 105 have a width W' which is larger than the width W of the pole element 115 defining the gap width. The superconducitng layers 117 preferably have a width which is larger than the width W. As is shown in FIG. 4, the SQUID 119 has two weak links 125 which may be constituted as Josephson junctions. Instead of the junctions, the weak links may alternatively be constituted as Dayem bridges or as proximity-effect junctions. In the later case a metal layer 127 (see FIG. 4a) is provided on the constriction 125 in order to further weaken the link via the constriction. The SQUID 119 is provided with two superconducting layers 129 for connection to a suitable detection circuit. It is to be noted that it is possible to dispense with the core body 101, in which case the protective blocks function as a core body.

In principle, the device shown in FIG. 5 has a more efficient configuration than the embodiment shown in FIG. 4 because this device comprises both a soft magnetic core body 101 and two soft magnetic protective blocks 103 and 105. Wide gaps 131 and 133 are present between the pole element 115 and the protective blocks 103 and 105, respectively. The afore-mentioned SQUID 121 which may be constituted as a d.c. SQUID or an r.f. SQUID with or without a negative feedback winding is located against the core body 101 with which the protective blocks 103 and 105 may in principle form an assembly.

The device of FIG. 6 has a configuration which is approximately as efficient as that of the embodiment of FIG. 5. The core body 101 and the protective block 105 constitute a component of a soft magnetic material. However, the protective bock 103 is made of a non-magnetic material such as Sr titanate, Ba titanate, Ca titanate, glass or $Al_2O_3$. A fairly wide gap 135 is present between the protective block 105 and the pole element 115. The SQUID 123, which may be of one of the types mentioned hereinbefore, is provided around the pole element 115, whilst one portion of the SQUID is present between the pole element and one of the superconducting layers 117 and another portion of the SQUID is present in the gap 135 and therefore between one of the said superconducting layers 117 and the magnetically permeable protective block 105.

In all embodiments it is of course of great importance to protect all components of the device, including the SQUID from external interference fields as much as possible, so that the SQUID does not get out of its operating range. This means for example that the conductors 51 and the SQUID 17 of the device of FIG. 2 will preferably be provided with protective superconducting sleeves.

The invention is of course not limited to the embodiments shown and more embodiments are possible within the scope of the invention. It is, for example possible to use gradiometer embodiments in which the turns of the SQUID loop or of the pick-up winding of the flux transformer are wound around two, four or more separate permeable layers, each layer having a face for magnetic coupling with the non-homogenously magnetized recording medium.

What is claimed is:

1. A device for reading information from a magnetic recording medium, which device comprises a transducing element and the magnetic yoke co-operating with the transducing element, the yoke being provided with a first flux guide and a second flux guide spatially separated locally therefrom, said device also having a face for magnetic flux coupling of the transducing element with the magnetic recording medium, characterized in that the transducing element is constituted by a superconducting quantum interference device (SQUID), provided with connection means for connecting the SQUID to a detection circuit.

2. A device as claimed in claim 1, characterized in that one of the flux guides projects through a central opening of the SQUID.

3. A device as claimed in claim 2, comprising a substrate on which a first magnetically permeable layer constituting the first flux guide and a second magnetically permeable layer constituting the second flux guide are provided, a transducing gap extending between permeable layers up to the said face for magnetic flux coupling, characterized in that the SQUID is encircles the second magnetically permeable layer, whilst a portion of the SQUID is present between the two magnetically permeable layers.

4. A device as claimed in claim 3, characterized in that an intermediate layer of a superconducting material is provided between the first magnetically permeable layer and the second magnetically permeable layer.

5. A device as claimed in claim 4, characterized in that the portion of the SQUID is present between the intermediate layer and the second magnetically permeable layer.

6. A device as claimed in claim 1, characterized in that a winding of a superconducting material is provided around one of the said flux guides, winding being inductively coupled to the SQUID by means of an electric conductor of a superconducitng material.

7. A device as claimed in claim 6, comprising a substrate on which a first magnetically permeable layer constituting the first flux guide and a second magnetically permeable layer constituting the second flux guide are provided, a transducing gap extending up to the face for magnetic flux coupling being present between said permeable layers, characterized in that the winding is provided around the second magnetically permeable layer, whilst a portion of the winding is present between the two magnetically permeable layers.

8. A device as claimed in claim 7, characterized in that an intermediate layer of a superconducting material is provided between the first magnetically permeable layer and the second magnetically permeable layer.

9. A device as claimed in claim 8, characterized in that the portion of the winding is present between the intermediate layer and the second magnetically permeable layer.

10. A device as claimed in claim 7, characterized in that a third magnetically permeable layer and a fourth magnetically permeable layer are provided on the substrate, which layers form part of a transformer yoke, whilst the electric conductor is wound around one of the layers of the transformer yoke and the SQUID is provided around one of the layers of the transformer yoke, a portion of the SQUID being present between the two magnetically permeable layers of the transformer yoke.

11. A device as claimed in claim 10, characterized in that a further intermediate layer of a superconducting material is provided between the third magnetically permeable layer and the fourth magnetically permeable layer.

12. A device as claimed in claim 11, characterized in that the portion of the SQUID is present between the intermediate layer and one f the magnetically permeable layers of the transformer yoke.

13. A device as claimed in claim 3, characterized in that it is realised in a thin-film technique.

14. A device as claimed in claim 3, characterized in that it is provided with a protective layer of a superconducitng material.

15. A device as claimed in claim 2, characterized in that it comprises a core body of a soft magnetic material having at least one protective block which is provided with a contact face for co-operating with the magnetic recording medium, and a magnetic pole element of a soft magnetic material extending from the core body to the proximity of the contact face, the pole element forming part of the first flux guide and the core body constituting the second flux guide, and in that the SQUID is provided around the magnetic pole element.

16. A device as claimed in claim 15, characterized in that the protective block consists at least partly of a soft magnetic material and in that a space accommodating at least a portion of the SQUID is present between the magnetic pole portion and the protective block.

17. A device as claimed in claim 15 characterized in that the pole element is at least partly coated with a layer of a superconducting material.

* * * * *